United States Patent

Beaman et al.

[11] Patent Number: 5,821,532
[45] Date of Patent: Oct. 13, 1998

[54] IMAGER PACKAGE SUBSTRATE

[75] Inventors: Bryan A. Beaman, Churchville; Julie K. Gerstenberger; David M. Orlicki, both of Rochester, all of N.Y.

[73] Assignee: Eastman Kodak Company, Rochester, N.Y.

[21] Appl. No.: 876,633

[22] Filed: Jun. 16, 1997

[51] Int. Cl.[6] ........................................ H01J 5/02
[52] U.S. Cl. .......................... 250/239; 250/216; 257/433
[58] Field of Search ..................... 250/239, 216, 250/214.1; 257/80, 81, 82–84, 432–434

[56] References Cited

U.S. PATENT DOCUMENTS

| | | | |
|---|---|---|---|
| 4,321,747 | 3/1982 | Takemura et al. | 29/572 |
| 4,479,298 | 10/1984 | Hug | 29/589 |
| 4,776,088 | 10/1988 | Biggs et al. | 29/834 |
| 4,924,297 | 5/1990 | Denda . | |
| 5,109,269 | 4/1992 | Holzman . | |
| 5,298,742 | 3/1994 | Friauf | 250/239 |
| 5,406,454 | 4/1995 | Dinger et al. | 361/752 |
| 5,418,691 | 5/1995 | Tokura | 361/803 |
| 5,468,996 | 11/1995 | Chan et al. | 257/723 |
| 5,530,291 | 6/1996 | Chan et al. | 257/723 |
| 5,532,519 | 7/1996 | Bertin et al. | 257/777 |

*Primary Examiner*—Que Le
*Attorney, Agent, or Firm*—James D. Leimbach

[57] ABSTRACT

An image head assembly comprising: a substrate with at least a pair of apertures formed in the substrate; an optical assembly having at least a pair of pins that mate with the apertures within the substrate, the pins to the optical assembly being fixedly secured to the apertures within the substrate; an image sensor located between the apertures covered by a cover glass above the image sensor on the optical assembly; interface means for providing an electrical connection between the substrate and the image sensor; a lens system mounted on top the cover glass; and a single element blur filter contained within the lens system. The assembly contains a single element blur filter such as a cross-pleated blur filter. The lens system is prevented from being a reverse telephoto lens system with use of a blur filter that does not require a large back focus and is instead a telephoto lens system.

8 Claims, 3 Drawing Sheets

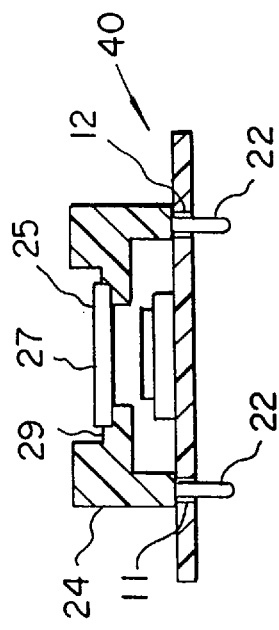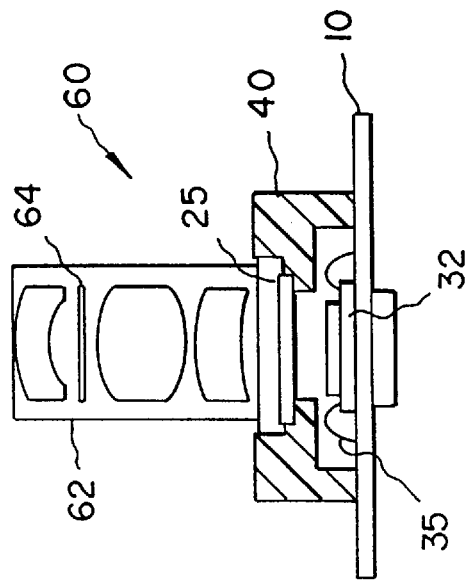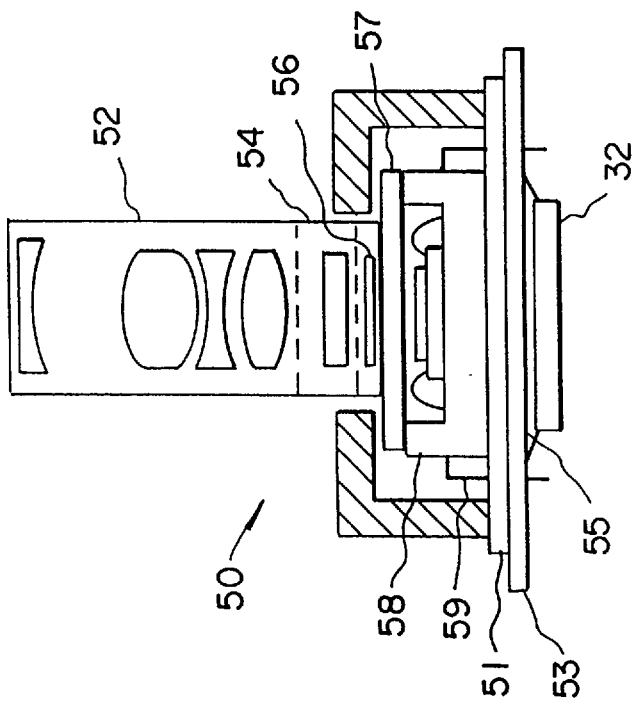

IMAGER PACKAGE SUBSTRATE

CROSS-REFERENCE TO RELATED APPLICATIONS

The present application is related to U.S. application Ser. No. 08/876634 (Kodak Docket No. 75814), filed Jun. 16, 1997, by Peter Zepetella et al., and entitled, "Circuit Board Standoff", U.S. application Ser. No. 08/876,456 (Kodak Docket No. 75819), filed Jun. 16, 1997 by Bryan Beaman, et al., and entitled "Integrated Imaging Head.", U.S. application Ser. No. 08/876,453 (Kodak Docket No. 75821), filed Jun. 16, 1997, by Dean Johnson and entitled, "Packaging of Imaging Devices Assembly," and U.S. application Ser. No. 08/876,376 (Kodak Docket No. 75822), filed Jun. 16, 1997 by Dean Johnson et al., and entitled "CCD Attachment Module."

FIELD OF THE INVENTION

The invention relates generally to the field of image sensor assemblies and in particular to reducing the size, number of parts and cost of image sensing assemblies.

BACKGROUND OF THE INVENTION

Solid state image sensors, and assemblies are well known within the prior art. Within these assemblies, the optical alignment of the lens optical centerline to the center of the imager die is critical. Typically, imager die are placed in packages with rather loose positional tolerance. In order to obtain proper alignment, existing packages are first actively aligned to a metal plate containing fiducial alignment features (holes) and bonded in place. The fiducial holes are then used to align the lens to the bonded assembly. These prior art assemblies mount the die in a package without reference to external mechanical features. The packaged part is then actively aligned to a separate piece to establish an alignment reference for optical component mounting.

The most common methods to package imagers is to mount the die in a ceramic or plastic DIP or LCC (leadless chip carrier) package and cover with a glass cover plate. The object is to get the die in a clean, hermetic like environment so that the delicate AC testing of the sensor can proceed. The historical yields at this step provide motivation to keep the value added up to this assembly step to a minimum. It is desirable to look at low cost solutions to enable testing of the imager at the earliest possible opportunity.

SUMMARY OF THE INVENTION

The present invention addresses the disadvantages of the prior art discussed above. In our system, the die is mounted in a known position to a substrate containing a fiducial hole pattern. That same hole pattern is then used as the mounting reference for the optics. Our system therefore eliminates the alignment plate of the existing art as well as the step of active alignment once the die is in its package. It is considerably simpler to find reference features on the die before it is placed in the package.

The proposal is to use a printed circuit board (PCB - FR4 Material) as the substrate to mount the imager and provide an interface to the test equipment. In addition, the concept includes moving the AC testing earlier in the assembly process before a housing (including a cover glass) are committed to the assembly. Features are included in the substrate and optical housing such that a passive alignment of the assembly is enabled.

The present invention is directed to overcoming one or more of the problems set forth above. Briefly summarized, according to one aspect of the present invention, an image head assembly comprising: a substrate with at least a pair of apertures formed in the substrate; an optical assembly having at least a pair of pins that mate with the apertures within the substrate, the pins to the optical assembly being fixedly secured to the apertures within the substrate; an image sensor located relative to the apertures covered by a cover glass above the image sensor on the optical assembly; interface means for providing an electrical connection between the substrate and the image sensor. A lens system mounted above the cover glass; and a single element blur filter contained within the lens system can also be used in conjunction with the above. The single element blur filter envisioned is a cross-pleated blur filter. The lens system would not be required to be a reverse telephoto lens system with use of a blur filter that does not require back focusing and is instead a telephoto lens system.

The keys elements to the invention are: the alignment of a semiconductor die to a fiducial reference point on an inexpensive substrate; alignment of an optical system to the same fiducials; and the use of the optical system mount to achieve hermetic like isolation of the die.

These and other aspects, objects, features, and advantages of the present invention will be more clearly understood and appreciated from a review of the following detailed description of the preferred embodiments and appended claims, and by reference to the accompanying drawings.
Advantageous Effect Of The Invention The present invention has the advantages of reduced size and cost for optical imaging heads. In addition to lower cost a higher volume potential is created from a simplified design that has fewer interfaces resulting in less tolerance accumulation.

BRIEF DESCRIPTION OF THE DRAWINGS

FIG. 4 illustrates the alignment of the optics assembly to the substrate.

FIG. 5 illustrates a conventional image head and its component elements existing within the prior art.

FIG. 6 illustrates the image head envisioned by the present invention.

To facilitate understanding, identical reference numerals have been used, where possible, to designate identical elements that are common to the figures.

DETAILED DESCRIPTION OF THE INVENTION

Figure 1:
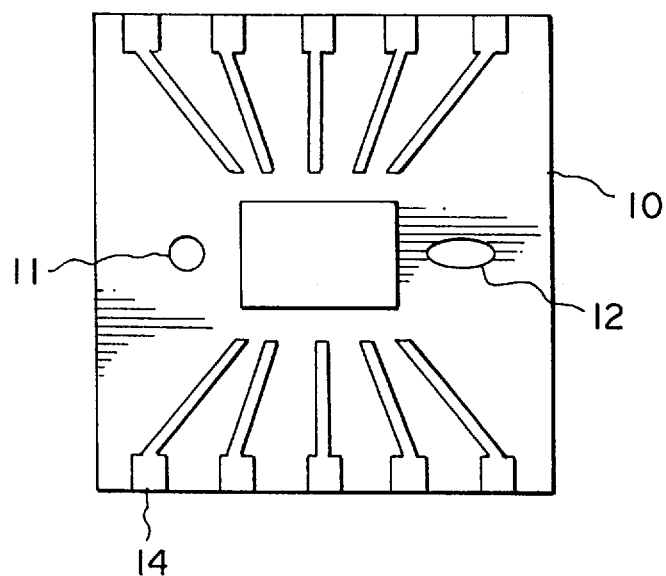
FIG. 1 illustrates the printed circuit substrate details showing alignment features and test pads.

Referring to FIG. 1 illustrates details of the printed circuit substrate 10 showing alignment features within the substrate 10 comprising a pair of apertures 11, 12 formed within the substrate 10. There are a plurality of test pads 14 provided that are to be wire bonded to a solid state image sensor.

Figure 2:
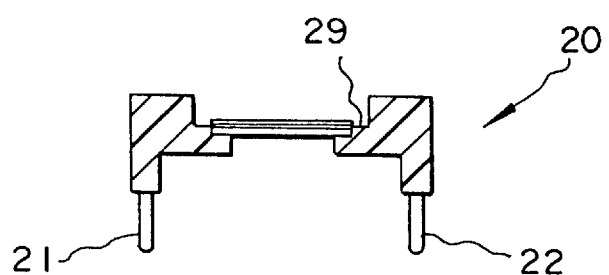
FIG. 2 illustrates the optics assembly and the alignment features of the optics assembly.

FIG. 2 illustrates an optics assembly 20 and the alignment features of the optics assembly 20. The optics assembly 20 has within the preferred embodiment a pair of pins 21, 22. These pins 21, 22 shown in FIG. 2 mate with the apertures 11, 12 within the substrate 10 shown in FIG. 1.

Figure 3A:
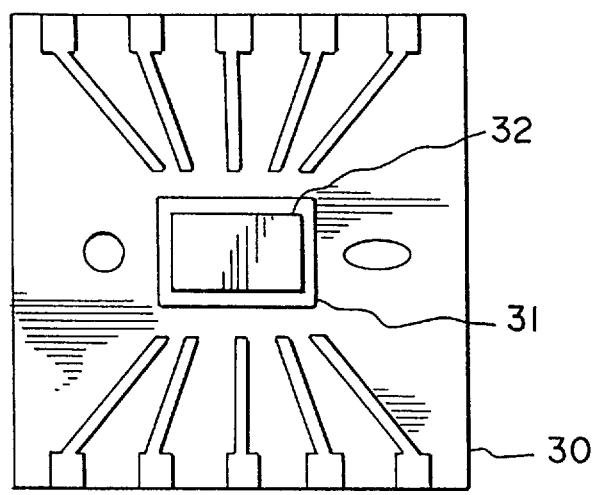
FIG. 3 illustrates the alignment of the die to the substrate.
Figure 3B:
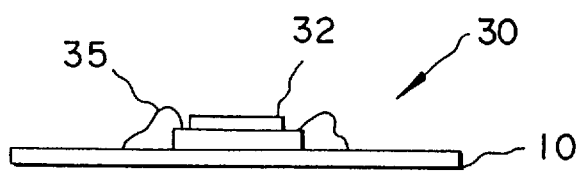

FIG. 3 illustrates the image sensor 32 die on substrate 10 assembly 30 the alignment of a solid state image sensor 32 to the substrate 10. The image sensor 32 is located in an area formed between apertures 11, 12, and is mounted directly to the substrate 10. The interface for providing an electrical connection between the substrate 10 and image sensor 32 is envisioned to be wire bonding (not shown) that will connect leads on the image sensor to the test pads 14 on substrate 10. In the preferred embodiment, the image sensor 32 is placed within a location area 31. The image sensor 32 is attached to the substrate 10 with an epoxy.

FIG. 4 illustrates the alignment of the optics assembly 20 to the substrate 10 to create assembly 40. Assembly 40 has the optics assembly 20 mounted within housing 24 via pins 21, 22 that are keyed to fit within apertures 11, 12. The cover glass 25 with IR filter 27 is contained on the housing 24. The optical elements as illustrated are needed to transmit light, provide a hermetic like barrier. It can be a plano glass element with or without an IR coating, or it may be an optical element with or without an IR coating, or it may be an optical element with optical power, i.e. a lens. The preferred embodiment is a plano cover glass 25 with a coating to create an IR filter 27. The assembly has a shelf 29 that is used to align cover glass and IR filters 27.

FIG. 5 illustrates a conventional image head 50 and its component elements existing within the prior art. A reverse telephoto lens 52 configuration is typically used to increase back focal distance when a multiple element quartz blur filter 54 is employed to accommodate the blur filter thickness. An IR filter 56 is typically placed within the image head 50 near the quartz blur filter 54 and above the cover glass lens 57 that sits upon DIP package 58. The image sensor 32 is electrically connected to contacts on DIP package 58 through wire bonds 55. The DIP package 58 is then mounted onto circuit board 53 on top of metal plate 51 and electrically connected to circuit board substrate 53 via leads 59. The configuration shown in FIG. 5 generally requires hand soldering of DIP package 58 to circuit board 53 because the image sensor contained within the DIP package 58 can easily be harmed by the high temperature of automated reflow solder processes. Metal plate 51 may also serve as a heat sink during this hand soldering process.

FIG. 6 illustrates the image head envisioned by the present invention that incorporates the optics assembly 40 that contains image sensor 32 as described above in the discussion relating to FIG. 4. The lens 62 used with the present invention is not the reverse telephoto type as discussed above. This configuration is possible because the blur filter element 64 is not a quartz blur filter that has many individual elements but is instead a cross-pleated blur filter 64. The combination of the cross-pleated blur filter 64 with a system of lens elements that does not require a large back focus reduces the overall height of the image head. It will be understood by those skilled in the art that the cross-pleated blur filter is a single element blur filter and that other types of single element blur filters would be equally feasible in making the image head 60 as shown in FIG. 6. The important requirement is that the blur filter not force usage of a lens with large back focus properties.

Still referring to FIG. 6 image sensor 32 is mounted directly upon substrate 10 as previously described with wire bonds 35 providing electrical interface between the image sensor 32 and substrate 10. As is readily apparent from FIG. 6, the optics assembly 40 is smaller and has less interfaces than the prior art arrangement in FIG. 5. Additionally, the present invention as shown in FIG. 6 has in combination with the optics assembly, the lens arrangement 62 and cross-pleated blur filter 64 that again reduce the size and the cost of the present invention as compared to the prior art.

The invention has been described in detail with particular reference to certain preferred embodiments thereof, but it will e understood that variations and modifications can be effected within the spirit and scope of the invention.

PARTS LIST 10 substrate
11 aperture
12 aperture
14 test pads
20 optical assembly
21 pin
22 pin
24 housing
25 cover glass
27 IR filter
29 shelf
30 die on the substrate assembly
31 location area
32 image sensor
35 wire bonding
40 assembly
50 prior art image head
51 metal plate
52 reverse telephoto lens
53 circuit board substrate
54 quartz blur filter
55 wire bonding
56 IR filter
57 cover glass
58 DIP package
59 leads
60 image head of the invention
62 lens elements
64 blur filter

What is claimed is:

1. An image head assembly comprising:

a printed circuit substrate with at least a pair of apertures formed in the substrate;

a cover glass assembly having at least a pair of pins that mate with the apertures within the printed substrate, the pins to the cover glass assembly being fixedly secured to the apertures within the printed circuit substrate;

an image sensor located on the printed circuit substrate between the apertures and covered by a cover glass on the cover glass assembly and above the image sensor;

interface means for providing an electrical connection between the substrate and the image sensor.

2. The assembly of claim 1 further comprising a lens system mounted on top the cover glass.

3. The assembly of claim 2 further comprising a single element blur filter contained within the lens system.

4. The assembly of claims 1 wherein the optics assembly further comprises a housing containing the pins with a cover glass contained on the housing.

5. The assembly of claim 1 wherein the optics assembly comprises a housing containing the pins with an integral lens element contained on the housing.

6. The assembly of claims 1 wherein the optical assembly further comprises a housing containing the pins with an IR filter contained on the housing.

7. The assembly of claim 1 where the optical assembly further comprises a housing containing a shelf to align cover glasses and IR filters.

8. The assembly of claim 1 where the blur filter is a cross-pleated blur filter.

* * * * *